United States Patent [19]

Holce et al.

[11] 4,371,856

[45] Feb. 1, 1983

[54] SWITCH ASSEMBLY INCLUDING CIRCUIT TEST POINTS

[75] Inventors: Thomas J. Holce, Portland; Charles M. Huckins, Tigard, both of Oreg.

[73] Assignee: Sentrol, Inc., Portland, Oreg.

[21] Appl. No.: 189,664

[22] Filed: Sep. 22, 1980

[51] Int. Cl.³ .............................................. H01H 9/02
[52] U.S. Cl. ..................... 335/202; 335/205; 339/147 P; 200/293; 200/51 R
[58] Field of Search ............ 335/151, 154, 205, 202; 339/147 P, 108 TB; 174/52 R; 200/51 R, 293, 61, 62

[56] References Cited

U.S. PATENT DOCUMENTS

| | | | |
|---|---|---|---|
| 2,852,631 | 9/1958 | White | 174/84 C |
| 3,249,714 | 5/1966 | Hyink et al. | 335/151 |
| 3,548,139 | 12/1970 | Maynard | 200/293 |
| 3,853,375 | 12/1974 | McClain | 339/60 R |
| 4,005,295 | 1/1977 | Mitchell et al. | 174/52 R |
| 4,053,705 | 10/1977 | Schmidt | 174/138 F |
| 4,213,110 | 7/1980 | Holce | 335/205 |
| 4,246,457 | 1/1981 | Teichert et al. | 335/151 |

Primary Examiner—John W. Shepperd
Attorney, Agent, or Firm—Chernoff & Vilhauer

[57] ABSTRACT

An assembly protectively housing an electrical component includes electrical test points connected to the electrical component and accessible by electrical test instrument probes to enable testing of the electrical component while the assembly is physically mounted in an operational location and electrically connected in a circuit. In one embodiment an end of a lead is exposed flush with the end of a rectangular housing. In another embodiment an end of a lead is exposed within a small well defined in an outer surface of the housing. In a third embodiment of the invention openings are provided in a cover portion of a housing to permit test probes to contact electrical circuit conductor terminals protectively contained within the housing.

10 Claims, 10 Drawing Figures

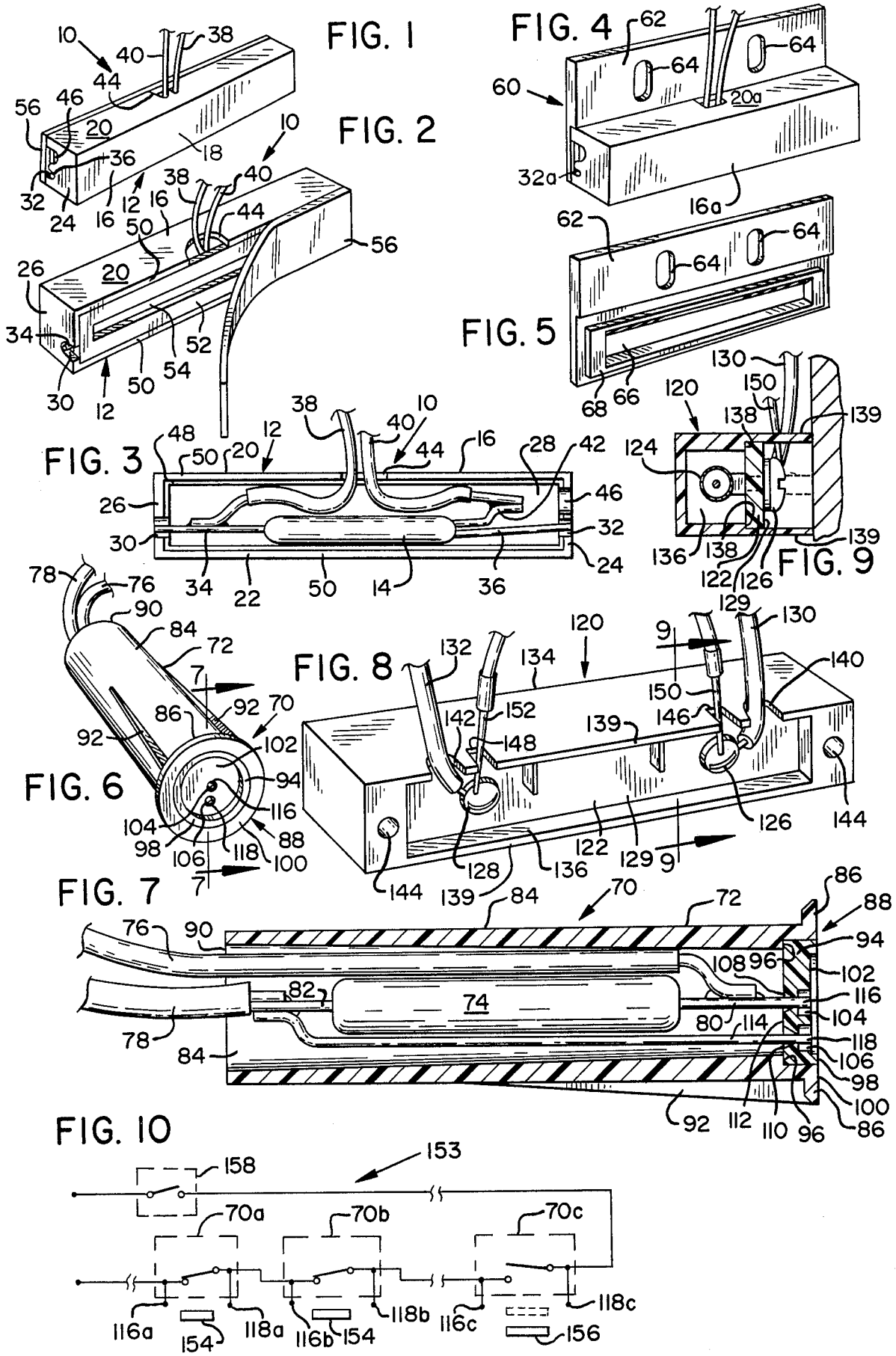

SWITCH ASSEMBLY INCLUDING CIRCUIT TEST POINTS

BACKGROUND OF THE INVENTION

The present invention relates to electrical switch assemblies, and particularly to a switch assembly capable of being tested without disconnecting the switch from an electrical circuit or removing the switch assembly from its mounted position.

It is normally desired to mount switch assemblies more or less permanently as part of an electrical circuit, yet it occasionally becomes necessary to test the operation of the included switches individually. It is usually desired to mount switches in a manner which protects and conceals circuit connection terminals and protects electrical conductors from inadvertent short circuits, in the case of industrial position controlling applications, and which protects connections from tampering, in the case of security alarm circuits.

Previously known switch assemblies designed for mounting on a surface such as a wall often have covered circuit connection terminals, to protect against tampering or inadvertent short circuiting. Access to the connection terminals requires removal of at least a portion of such a housing from its mounting position. Other known switch housings are designed for mounting in a recessed position, sometimes having one surface of the switch housing substantially flush with the surrounding wall or other surface.

Once installed, when such switch assemblies comprise magnetically actuated reed switches, as in the case of proximity switch assemblies used for industrial position controlling applications and to monitor the status of doors and windows, etc., little maintenance is normally required. Testing is necessary, however, during initial installation, or in the case of malfunction, since electrical overloading may occasionally cause switch contacts to fuse together. More frequently, a magnetic reed switch may fail to actuate because the actuating magnet has been displaced from its proper location.

In applications such as physical security monitoring alarm systems, several magnetically actuated switches are frequently interconnected in one series circuit requiring each switch in the circuit to be closed in order for the system to indicate a normal condition. When one switch of the circuit fails to close, even though all doors, windows, and the like being monitored by the alarm system are in their proper locations, it has previously been very difficult to test the several switches of the system to determine which switch is malfunctioning.

Testing of switches in a series loop circuit has previously required disconnection of the individual switches from a circuit. Quite often removal of a switch from its mounted location, particularly if the switch is mounted in a flush or recessed location, results in damage to a switch which was previously undamaged. Additionally, removal and replacement of switches frequently results in damage to the appearance of the switch location. Testing of a circuit may also require establishing some form of electrical communication between a person operating a switch and another person monitoring operation of the switch at a remote junction box.

While it is possible to individually check each switch of a series circuit if conductors are provided from each individual switch to a central connection box, using a wiring scheme called "home running," this requires undesirably large and costly amounts of wire, as well as provision of an otherwise unnecessary junction box.

A somewhat less expensive wiring scheme is called "zoning." By providing several "zones," series connected loops containing only a few switches in each loop, a malfunction can be traced to a single loop. "Zoning," however, still requires disconnection for testing of each switch in the malfunctioning "zone," until the defective switch has been found.

Similar difficulties are presented when a group of several parallel connected switches are normally open, but one switch of the group remains closed as a result of a malfunction. This condition has also previously required disconnection of each switch to locate the malfunction.

What is needed, therefore, is a switch assembly capable of being mounted in a way to present a pleasant appearance, including a housing which protects the switch and prevents undesired access to the circuit of which the switch is a part, but which permits local electrical testing of the operation of each switch in its installed position without electrically disconnecting the switch from its circuit.

SUMMARY OF THE INVENTION

The above-mentioned drawbacks and shortcomings of previously known magnetically actuated switch assemblies are overcome by the present invention, which provides an electrical component mounting assembly which permits testing of each individual electrical component of a series connected loop while the components remain connected in the electrical circuit. A switch assembly according to the invention permits such testing of each switch without the need to move the switch assembly physically or to disconnect the switch from the circuit of which it is a part.

In a switch assembly according to the present invention a housing provides physical support and protection for the switch. It also protectively covers any connection terminals provided for interconnecting the switch into a circuit. Access is provided in the housing, however, to permit a probe tip to be brought into contact with one or more of the conductors connected to the switch, so that an electrical testing device, such as an ohmmeter, may be used to locally ascertain the condition of the switch.

A first switch assembly according to the invention includes an encapsulated magnetically actuated reed switch. At least one switch lead wire extends from the capsule of the reed switch through a groove provided in an edge of a shell portion of the housing. A back plate fits against the lead wire, helping to hold the encapsulated switch inside the housing and retaining the lead wire in the groove. The switch lead wire is preferably cut flush with the exterior surface of the housing, leaving only the end of the switch lead wire exposed, as a test point for being contacted by a meter probe, while the remainder of the lead wire is protectively covered by the housing. Insulated conductor wires for permanent interconnection into the electrical circuit are connected to the appropriate switch leads within the housing, and extend outward through an opening provided.

In another variation of the invention a switch assembly adapted for mounting in a recessed position includes a tubular housing having a circular end plate which may be mounted flush with the surface of the structure within which the switch assembly is mounted. A recessed portion of the end plate includes at least one small well, and one or more test point leads extend outwardly through the end plate from the switch enclosed in the housing, each terminating within one of the small wells defined in the depressed portion of the end plate.

Each conductor is cut off flush with the level of the depressed portion of the housing, leaving a space within each well of approximately 0.020 to 0.030 inch surrounding the short exposed test point portion of the lead. This permits the end of a probe, such as an ordinary electrical multimeter probe, to be placed into electrical contact with each of the exposed conductors from the switch. Actuation of the switch may thus be tested without disconnecting the switch from the circuit or removing the switch assembly physically from its position recessed within, for example, a wall.

Lastly, in a switch assembly of relatively large dimensions designed for mounting on a surface such as a wall, screw-post electrical circuit conductor connection terminals are provided on the back side of the housing, the side which is adjacent to the surface on which the switch assembly is mounted. Small slots are provided in the housing in a position which permits a probe to be inserted therethrough to make electrical contact with the screws of the terminals.

When the electrical component included in an assembly according to the invention is a magnetic reed switch, the electrical test points made accessible for contact by a probe are electrically connected respectively to the two reed switch contacts which are normally open in the absence of an external magnetic field and closed in the presence of a magnetic field of sufficient strength. The condition of the switch is ascertained by using an ohmmeter to determine whether the contacts of the particular switch close and open when a magnet is brought near and removed from proximity to the switch assembly. In most cases the magnet used will be the installed actuating magnet associated with a door or window being monitored by a security alarm circuit, or the actuating magnet carried by a moving part of a mechanism controlled by a proximity switch circuit, in an industrial position controlling system.

It is therefore a primary objective of the present invention to provide an electrical circuit component mounting assembly permitting testing of circuit component actuation without removal of the component and its housing from an installed position.

It is another important objective of the present invention to provide a switch assembly for use in a series connected circuit including several switches, to permit testing of individual switches of the series without disconnection from the circuit or removal from a mounting position.

It is another objective of the present invention to provide a switch assembly adapted for installation in a recessed location and connected by concealed wiring, yet permitting electrical testing of switch actuation without removal of the switch from its recessed location or disconnection of the switch from the electrical circuit of which it is a part.

It is yet a further objective of the present invention to provide a switch assembly for mounting against a flat surface, including a housing which protectively covers circuit connection terminals, yet permits local access to the switch-controlled circuit for electrical testing of switch actuation.

It is a primary feature of the present invention that it provides a proximity switch assembly including test points which are protectively covered except for an exposed end of a conductor which is electrically connected to a switch to permit electrical determination of switch operation.

It is another important feature of the present invention that it provides a switch assembly including a housing which protects the switch and circuit connection terminal posts from undesired tampering, yet which includes test points which may be electrically contacted by appropriate probes to permit electrical testing of switch actuation.

It is a further feature of the present invention that it provides a switch assembly including small test points which are readily accessible for contact by test probes, but which are unobtrusive in appearance and protected from accidental contact.

It is an important advantage of the present invention that it provides a switch assembly whose operation is easier to test than previously available switch assemblies for use in security alarm circuits and industrial position controlling circuits.

It is another advantage of the present invention that it provides a switch assembly for use in a series connected circuit which may be connected to permit testing of individual switches of a circuit more cheaply than previously known switches for security systems.

It is a further advantage of the present invention that it permits individual switches to be tested more easily in their normal operational location, providing a more accurate indication of operability of a security system than was previously possible.

The foregoing and other objectives, features and advantages of the present invention will be more readily understood upon consideration of the following detailed description of the invention taken in conjunction with the accompanying drawings.

BRIEF DESCRIPTION OF THE DRAWINGS

FIG. 1 is a pictorial view of the front and left end of a switch assembly embodying the present invention.

FIG. 2 is a pictorial view of the rear side and right end of the switch assembly shown in FIG. 1.

FIG. 3 is a rear elevational view of the shell portion of the switch assembly of FIG. 2.

FIG. 4 is a pictorial view of an alternative switch assembly according to the present invention.

FIG. 5 is a pictorial view of the rear plate portion of the switch assembly shown in FIG. 4.

FIG. 6 is a pictorial view of a generally cylindrical switch assembly embodying the present invention.

FIG. 7 is a sectional view, at an enlarged scale, of the switch assembly shown in FIG. 6, taken along line 7—7.

FIG. 8 is a pictorial view showing the rear side of a switch assembly which is a second alternative embodiment of the present invention.

FIG. 9 is a sectional view of the switch assembly shown in FIG. 8, taken along line 9—9.

FIG. 10 is a schematic diagram of an exemplary series-connected circuit including a plurality of switch assemblies embodying the present invention.

DETAILED DESCRIPTION OF THE INVENTION

Referring now to FIGS. 1-3 of the drawings, a switch assembly 10 which is an exemplary embodiment of the present invention comprises a housing 12 made, for example, of a moldable plastic material, which protectively contains and supports a small electrical component such as an encapsulated magnetic reed switch 14 (FIG. 3).

The housing 12 comprises a shell member 16 which includes a front side 18. Extending rearwardly from the front side 18 are a top member 20, a bottom member 22, a left end member 24, and a right end member 26, all of which cooperatively define a cavity 28 within the shell 16. A generally U-shaped groove 30 is defined in the right end 26, and a similar groove 32 is defined in the left end member 24.

A reed switch lead 34 extends from one end of the reed switch 14 through the groove 30, while another reed switch lead 36 extends from the opposite end of the reed switch 14 through the groove 32. An insulated electrical conductor 38 is electrically connected to the reed switch lead 34, while a similar insulated electrical conductor 40 is electrically connected to a third reed switch lead 42 which extends from the same end of the reed switch 14 as does the lead 36. The electrical circuit conductors 38 and 40 extend as desired through either a rounded notch 44 in the top member 20, or a rounded notch 46 in the left end member 26.

A ledge 48 is recessed slightly into the cavity 28 from the edges 50 of the shell member 16, and a rear plate 52 rests against the ledge 48, surrounded by the edges 50 of the shell member 16, retaining the reed switch 14 within the cavity 28 and holding the reed switch leads 34 and 36 in the respective grooves 30 and 32.

An open slot 54 is defined in the rear plate 52 permitting insertion of an adhesive material such as an epoxy potting compound into the cavity 28 to adhesively retain the reed switch therein and adhesively secure the rear plate 52 to the shell member 16.

Once the electrical component such as the switch 14 has been installed, with the rear plate 52 and the electrical component potted in place, the leads 34 and 36 are trimmed close to, and preferably flush with the exterior of the shell 16. This leaves only the end of each lead 34 and 36 exposed, where it can be contacted by a pointed meter probe, but is not easily susceptible to tampering.

A layer of adhesive material, such as a piece of a resilient tape 56 of appropriate size having an adhesive facing on each side, is provided for the purpose of securing the switch assembly 10 to a surface. Because of the small size of the switch assembly 10, for example, approximately 1½ inches long, ⅜ inch high, and 5/16 inch from front to rear, the adhesive tape 56 is sufficiently secure, particularly when conductors 38 and 40 are also separately secured to a wall on which the switch assembly 10 is mounted.

Referring now to FIGS. 4 and 5, a switch assembly 60 is similar to the switch assembly 10. A rear plate 62, however, instead of fitting entirely within the shell portion 16a, which is similar to the shell portion 16, overlaps the edges of the shell 16a and extends upwardly beyond the top member 20a of the shell 16a. A pair of apertures 64 are provided in a portion of the rear plate 62 which extends above the top member 20a to permit attaching the switch to a surface by means of screws and the like. As in the rear plate 52, a slot 66 is provided in the rear plate 62 to permit potting material to be introduced into the cavity 28a defined within the shell member 16a to retain the switch or other electrical component within the housing once it has been assembled with appropriate leads extending through the grooves 30a and 32a. A raised portion 68 extends into the shell member 16a in the same manner in which the rear plate 52 fits within shell member 16.

As with assembly of the switch assembly 10, once the electrical component has been installed and the rear plate 62 inserted, the electrical component is potted in place. The leads from electrical components are then trimmed, preferably flush with the exterior surface of the shell portion 16a, leaving only the ends of the leads exposed for electrical contact by a test meter probe. The leads are then well protected and unlikely to be accidentally contacted or subjected to tampering.

Turning next to FIGS. 6 and 7, a switch assembly 70 may be seen to comprise a generally cylindrical switch housing 72 designed for recessed mounting within a structure such as a building wall to protectively contain an elongate electrical component such as an encapsulated reed switch 74. Insulated electrical conductors 76 and 78 are connected respectively to switch leads 80 and 82 of the reed switch 74, and extend within the interior of the wall, where they are protectively concealed. Such a switch assembly 70 is particularly adapted for use in a security monitoring alarm system to indicate unauthorized opening of a door or window, since its presence, and thus the presence of the alarm system, is nearly completely concealed and is therefore very unlikely to invite tampering.

The housing 72, which may preferably be made of a moldable plastic material, comprises a generally tubular barrel 84. A flange 86 extends outwardly around a first end 86 of the barrel 84, while the conductors 76 and 78 extend outwardly through a second end 88 of the barrel 84. A plurality of spaced apart tapered fins 92 extend from the flange 86 and along the barrel 84, to provide an interference with the interior surface of a cylindrical hole within which the switch assembly 70 may be mounted, to secure the switch assembly 70 in place.

An end plate 94 fits within the first end 88 of the barrel 84, closing the first end 88. A shoulder 96 locates the end plate 94 so that the outer side 98 of the end of plate 94 is flush with an end surface 100 of the barrel 84. A recessed portion 102 which is generally flat and spaced a slight distance inwardly from said end surface 100, is defined in the center of the outer side 98. A pair of wells 104 and 106, small generally cylindrical depressions, are defined within the recessed portion 102.

Orifices 108 and 110 extend respectively through the center of the bottom surfaces of the wells 104 and 106 to the inner side 112 of the end plate 94. The end of each orifice 108 and 110 on the inner side 112 is preferably chamfered, to facilitate insertion of a wire through the orifice.

A switch test lead 114 is electrically connected with the switch lead 82 and extends alongside the reed switch 74. The switch lead 80 extends through the orifice 108 into the well 104, while the test lead 114 extends through the orifice 110 into the well 106. The orifices 108 and 110 are preferably small enough to fit tightly around the leads 80 and 114 to grip them during assembly.

The switch assembly 70 is preferably assembled by connecting the conductors 76 and 78 to the respective switch leads, connecting the test lead to the switch lead 82, inserting the switch lead 80 through the orifice 108 and the test lead 114 through the orifice 110 of the end plate 94, and thereafter sliding the barrel 84 along the conductors 76 and 78 and over the reed switch 74 and the end plate 94 until the end plate 94 is seated against the ledge 96.

Thereafter the entire barrel 84 may be filled with an epoxy potting material which adhesively retains the electrical leads and the end plate 94 appropriately positioned with respect to the barrel 84. When the epoxy potting material has cured properly the ends of the switch lead 80 and the test lead 114 are trimmed, preferably flush with the recessed portion 102 of the end plate 94.

As a result the switch lead 80 and the test lead 114 are exposed respectively within the well 104 and well 106, providing test points 116 and 118 which may be contacted by insertion of at least a pointed tip of a test probe into the respective well. The size of the well is preferably large enough to allow the insertion of a pointed probe tip alongside the lead test points 116 or 118, yet small enough so that an ordinary probe tip is held against, and in electrical contact with, the test point by contact with the interior surface of the respective well. For example, a cylindrical well 104 or 106 could be about 0.050 inches wide, and 0.040 inches deep, to receive a lead 80 or 114 of 0.025 inch diameter. Preferably such a well would be no more than about 0.1 inch in diameter and depth and the orifice 108 or 110 would be no more than 0.05 inch in diameter.

Electrical contact is easily made with the test point of the housing 72 of the invention when desired, yet the recessed location and small size of the wells 104 and 106 protect the switch circuit from inadvertent short circuiting. Electrical testing of switch operation is thus possible without the need to remove the switch assembly 70 physically from its mounting position, and without the necessity to electrically disconnect the switch 74 from a circuit.

A third embodiment of the invention may be seen in FIGS. 8 and 9, where a switch assembly 120 comprises a mounting plate 122, on an interior side 123 of which an electrical component, such as an encapsulated magnetic reed switch 124, is physically mounted. Screw terminals 126 and 128, located on an exterior side 129 of the mounting plate 122, are electrically connected to the reed switch 124 and permit connection of electrical conductors 130 and 132 to the reed switch 124.

A cover member 134 includes an interior recessed portion 136 for receiving the mounting plate 122 and electrical component mounted thereon. A ledge 138 within the recessed portion 136 properly locates the mounting plate 122 therein, with a lip portion 139 of the cover member 134 extending rearwardly beyond the exterior side 129 of the mounting plate 122. U-shaped notches 140 and 142 are provided in the lip portion 139 of the cover member 134 for allowing the conductors 130 and 132 to extend outwardly from within the recessed portion 136.

The switch assembly 120 may be attached against a surface exemplarily by means of screws inserted through apertures 144, with the recessed portion 136 and the exterior side 129 facing toward such a surface. Mounting the switch assembly 120 in this manner protects the terminals 126 and 128 from accidental contact and tampering.

In order to permit electrical testing of the operation of the reed switch 124 a pair of small slots 146 and 148 are provided in the lip portion 139 of the cover member 134, aligned respectively with the terminals 126 and 128. The slots 146 and 148 are preferably about 3/32 inch wide and extend preferably about 5/32 inch into the lip portion 139 of the cover member 134, permitting insertion of elongate needle-like test probes 150 and 152 to contact the terminals 126 and 128 respectively. The reed switch 124 of the switch assembly 120 may thus be tested without disconnecting conductors 130 and 132 from the terminals and without removing the switch assembly 120 from its mounting position.

The advantages of the present invention may be more fully appreciated by referring to the simplified alarm circuit 153 shown schematically in FIG. 10, in which a plurality of switch assemblies 70 are interconnected. As shown in FIG. 10, an actuating magnet 154 is properly located with respect to each of the switch assemblies 70a and 70b, holding the respective reed switches 74a and 74b closed. The actuating magnet 156 is improperly located with respect to the switch assembly 70c, and the reed switch 74c is therefore not magnetically actuated. Since the switches 70a-70c are interconnected in series, one switch which is open will prevent a normal signal through the series circuit, but will not provide an indication of which switch has not properly closed.

Because of the provision of the test points 116 and 118 of each of the switch assemblies 70a-70c, the alarm circuit 153 may be opened, as by means of a manually operated switch 158. Thereafter each of the switch assemblies 70a-70c may be tested while it remains in the circuit by bringing the test probes of an ohmmeter into contact with the test points 116 and 118 of each switch assembly 70a-70c. The infinite resistance which will be shown between test points 116c and 118c of switch assembly 70c will indicate that switch assembly 70c is the malfunctioning one and that the cause of the malfunction should be investigated.

The switch assemblies 10 and 60 are used similarly, the needle-like test probes of suitable electrical test equipment being placed into electrical contact with the very small exposed tips of the switch leads 34 and 36. The reed switch 14 is of the single pole double throw type in which the flexible magnetic reed of the switch is connected to the lead 34 and is elastically biased into electrical contact with a contact point connected to the reed switch lead 42, in the absence of a predetermined magnetic field. When a magnetic field of a predetermined strength and orientation is present, the flexible magnetic reed within the reed switch 14 is attracted to a contact connected to the reed switch lead 36, breaking the circuit between the conductors 38 and 40 and providing electrical connection between the leads 34 and 36. The switch assembly of the invention can thus be used in ascertaining the condition of each one of a group of switches connected in parallel and intended to close when an actuating magnet carried on a movable machine part, or on a door, moves away from the switch.

The terms and expressions which have been employed in the foregoing specification and used therein as terms of description and not of limitation, and there is no intention, in the use of such terms and expressions, of excluding equivalents of the features shown and described on portions thereof, it being recognized that the scope of the invention is defined and limited only by the claims which follow.

What is claimed is:

1. A housing for recessed mounting of an electrical circuit component such as an encapsulated magnetic reed switch, comprising:
    (a) a tubular barrel having a first end adapted to be exposed flush with a mounting surface when said housing is mounted in a recessed position relative to said mounting surface and a second end adapted to be inserted into an opening through a surface with respect to which said housing is mounted in a recessed position;

(b) end closing means for closing said first end, said end closing means having an outer side and an inner side, said outer side thereof being aligned flush with said first end of said tubular barrel and including a recessed central portion;

(c) at least one orifice extending through said recessed central portion from said inner side to said outer side;

(d) a separate well defined within said recessed central portion surrounding each said orifice, each said well defining a space surrounding the respective orifice permitting insertion of an electrical test probe at least partially within said well; and (e) said second end of said barrel being open.

2. The housing of claim 1, said first end defining interior shoulder means for locating said end closing means, and said end closing means comprising an end plate having said outer side and inner side, said end plate fitting closingly within said first end, abutting against said shoulder means, with said outer side aligned flush with said first end of said tubular barrel.

3. The housing of claim 1 or 2 including at least two said orifices extending through said central portion.

4. The housing of claim 1 or 2, wherein each said orifice is chamfered on said inner side of said end closing means.

5. An electrical circuit component assembly for recessed mounting, comprising:

(a) a tubular barrel having first and second open ends, said first end adapted to be exposed substantially flush with a surface with respect to which said assembly is to be recessed;

(b) end closing means attached to said tubular barrel for closing said first end thereof, said end closing means having an outer side and an inner side;

(c) an electrical circuit component located within said tubular barrel;

(d) at least one orifice extending through said end closing means;

(e) said circuit component including at least two electrical leads electrically connected thereto, at least one of said electrical leads extending through a respective orifice from said electrical circuit component located within said tubular barrel to said outer side as a test point;

(f) a separate well defined in said outer side surrounding each said orifice, said well defining sufficient space for insertion of an electrical test probe at least partially therein to electrically contact said respective electrical lead; and (g) a respective conductor electrically connected to each said electrical lead at a location within said barrel, each said conductor extending from the respective electrical lead outwardly from said barrel through said second end for connection into an electrical circuit.

6. The assembly of claim 5, wherein said end closing means comprises an end plate fitted closingly within said first end of said tubular barrel, said end plate including said inner and outer sides, said tubular barrel including interior shoulder means for locating said end plate with said outer side aligned flush with said first end of said tubular barrel.

7. The assembly of claim 5 or 6 wherein each said electrical lead which extends through a respective orifice extends no further outward than substantially flush with said outer side.

8. The assembly of claim 5 or 6 wherein said electrical circuit component is a magnetic reed switch.

9. The assembly of claim 5 or 6, said end closing means including a recessed central portion, each said orifice being located in said recessed central portion, and each said electrical lead which extends through a respective orifice extending substantially no further than flush with said recessed central portion.

10. The assembly of claim 5 or 6 wherein each said orifice is chamfered on said inner side of said end closing means.

* * * * *